US009155156B2

(12) United States Patent
Szczeszynski

(10) Patent No.: US 9,155,156 B2
(45) Date of Patent: Oct. 6, 2015

(54) ELECTRONIC CIRCUITS AND TECHNIQUES FOR IMPROVING A SHORT DUTY CYCLE BEHAVIOR OF A DC-DC CONVERTER DRIVING A LOAD

(75) Inventor: Gregory Szczeszynski, Hollis, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 796 days.

(21) Appl. No.: 13/177,070

(22) Filed: Jul. 6, 2011

(65) Prior Publication Data

US 2013/0009557 A1 Jan. 10, 2013

(51) Int. Cl.
*H05B 37/02* (2006.01)
*H03K 7/08* (2006.01)
*H05B 33/08* (2006.01)

(52) U.S. Cl.
CPC ........ *H05B 33/0887* (2013.01); *H05B 33/0827* (2013.01)

(58) Field of Classification Search
CPC .... H05B 37/00; H05B 37/02; H05B 33/0806; H05B 33/0809; H05B 33/0833; H05B 33/0842
USPC ......... 315/186, 193, 217, 224, 238, 291, 297, 315/302, 300, 307–308; 323/271, 282, 266, 323/276, 299
See application file for complete search history.

(56) References Cited

U.S. PATENT DOCUMENTS 4,739,226 A 4/1988 Murata
6,222,385 B1 4/2001 Kang
6,621,235 B2 9/2003 Chang
6,636,104 B2 10/2003 Henry
6,690,146 B2 2/2004 Burgyan et al.
6,822,403 B2 11/2004 Horiuchi et al.
6,930,679 B2 8/2005 Wu et al.
6,963,175 B2 11/2005 Archenhold et al.
7,116,086 B2 10/2006 Burgyan et al.
7,129,679 B2 10/2006 Inaba et al.
7,148,632 B2 12/2006 Berman et al.
7,235,954 B2 6/2007 Murakami
7,291,989 B2 11/2007 Namba et al.
7,307,614 B2 12/2007 Vinn
7,317,403 B2 1/2008 Grootes et al.

(Continued)

FOREIGN PATENT DOCUMENTS

EP 1 079 667 A2 2/2001
EP 1 079 667 A3 2/2001

(Continued)

OTHER PUBLICATIONS

PCT International Preliminary Report on Patentability and Written Opinion of the ISA dated Jan. 16, 2014; for PCT Pat. App. No. PCT/US2012/043275; 6 pages.

(Continued)

*Primary Examiner* — Douglas W Owens
*Assistant Examiner* — Henry Luong
(74) *Attorney, Agent, or Firm* — Daly, Crowley, Mofford & Durkee, LLP

(57) ABSTRACT

An electronic circuit, referred to as an on-time extension circuit herein, provides an ability to adjust a power delivered to a load by pulsing a predetermined current to the load. The on time of the a DC-DC converter used to provide the power is extended to be longer than the on time of the current pulse when the on time of the current pulses becomes very short.

44 Claims, 6 Drawing Sheets

(56) References Cited

U.S. PATENT DOCUMENTS

| | | | | |
|---|---|---|---|---|
| 7,375,472 | B2 | 5/2008 | Wong et al. | |
| 7,466,082 | B1 | 12/2008 | Snyder et al. | |
| 7,479,743 | B2 | 1/2009 | Namba et al. | |
| 7,482,765 | B2 | 1/2009 | Ito et al. | |
| 7,528,551 | B2 | 5/2009 | Ball | |
| 7,675,245 | B2 | 3/2010 | Szczeszynski et al. | |
| 7,675,246 | B2 | 3/2010 | Chiang et al. | |
| 7,928,670 | B2 | 4/2011 | Chen et al. | |
| 7,999,487 | B2 | 8/2011 | Szczeszynski | |
| 8,169,161 | B2 | 5/2012 | Szczeszynski et al. | |
| 8,482,225 | B2 | 7/2013 | Szczeszynski | |
| 8,653,756 | B2 | 2/2014 | Szezeszynski et al. | |
| 2004/0051478 | A1 | 3/2004 | Otake et al. | |
| 2004/0251854 | A1 | 12/2004 | Matsuda et al. | |
| 2004/0251942 | A1 | 12/2004 | Chiu et al. | |
| 2005/0088207 | A1 | 4/2005 | Rader et al. | |
| 2005/0104542 | A1 | 5/2005 | Ito et al. | |
| 2005/0110469 | A1 | 5/2005 | Inaba et al. | |
| 2005/0156540 | A1 | 7/2005 | Ball | |
| 2005/0243022 | A1 | 11/2005 | Negru | |
| 2005/0243041 | A1 | 11/2005 | Vinn | |
| 2006/0022916 | A1* | 2/2006 | Aiello | 345/82 |
| 2006/0028147 | A1 | 2/2006 | Shinmen et al. | |
| 2006/0114954 | A1 | 6/2006 | Wong et al. | |
| 2006/0125320 | A1 | 6/2006 | Namba et al. | |
| 2006/0139299 | A1 | 6/2006 | Tsuchiya | |
| 2006/0170287 | A1 | 8/2006 | Ito et al. | |
| 2006/0250824 | A1 | 11/2006 | Wekhande et al. | |
| 2007/0120506 | A1 | 5/2007 | Grant | |
| 2007/0182701 | A1 | 8/2007 | Kim et al. | |
| 2007/0267978 | A1 | 11/2007 | Shteynberg et al. | |
| 2008/0048573 | A1 | 2/2008 | Ferentz et al. | |
| 2008/0144236 | A1 | 6/2008 | Chiang et al. | |
| 2008/0164828 | A1 | 7/2008 | Szczeszynski et al. | |
| 2009/0021384 | A1 | 1/2009 | Jacubovski et al. | |
| 2009/0128045 | A1 | 5/2009 | Szczeszynski et al. | |
| 2009/0195183 | A1 | 8/2009 | Yang | |
| 2009/0212717 | A1 | 8/2009 | Trattler | |
| 2009/0289559 | A1 | 11/2009 | Tanaka et al. | |
| 2009/0302776 | A1 | 12/2009 | Szczeszynski | |
| 2010/0019696 | A1 | 1/2010 | Kimura | |
| 2010/0052552 | A1 | 3/2010 | Kimura | |
| 2010/0060177 | A1 | 3/2010 | Takata et al. | |
| 2010/0066255 | A1 | 3/2010 | Roberts | |
| 2010/0072922 | A1* | 3/2010 | Szczeszynski et al. | 315/297 |
| 2010/0109550 | A1* | 5/2010 | Huda et al. | 315/287 |
| 2010/0140621 | A1 | 6/2010 | Yang et al. | |
| 2010/0148691 | A1 | 6/2010 | Kuo et al. | |
| 2010/0164581 | A1 | 7/2010 | Zhang et al. | |
| 2010/0181939 | A1 | 7/2010 | Inoue et al. | |
| 2010/0207547 | A1 | 8/2010 | Kuroki et al. | |
| 2010/0259177 | A1* | 10/2010 | Mednik et al. | 315/185 R |
| 2010/0327835 | A1 | 12/2010 | Archibald | |
| 2011/0026277 | A1 | 2/2011 | Strijker | |
| 2011/0032008 | A1 | 2/2011 | Zhao et al. | |
| 2011/0062929 | A1 | 3/2011 | Strydom et al. | |
| 2011/0133645 | A1 | 6/2011 | Kuo et al. | |
| 2011/0204947 | A1 | 8/2011 | Qiu et al. | |
| 2011/0298384 | A1 | 12/2011 | Tanigawa et al. | |
| 2012/0146541 | A1 | 6/2012 | Szczeszynski et al. | |
| 2012/0181939 | A1 | 7/2012 | Szczeszynski et al. | |
| 2013/0009556 | A1 | 1/2013 | Szczeszynski et al. | |
| 2013/0009557 | A1 | 1/2013 | Szczeszynski | |
| 2013/0207632 | A1 | 8/2013 | Thandi et al. | |
| 2014/0055045 | A1 | 2/2014 | Raval et al. | |

FOREIGN PATENT DOCUMENTS

| | | | |
|---|---|---|---|
| EP | 1 499 165 | A2 | 1/2005 |
| JP | 3-196280 | | 8/1991 |
| JP | H06-044807 | | 2/1994 |
| JP | H11-507750 | A | 7/1999 |
| JP | 2002-257871 | A | 9/2002 |
| JP | 2002-281345 | A | 9/2002 |
| JP | 2003-063062 | | 3/2003 |
| JP | 2003-215534 | | 7/2003 |
| JP | 2004-134147 | A | 4/2004 |
| JP | 2005-116738 | A | 4/2005 |
| JP | 2006-005381 | | 1/2006 |
| JP | 3755770 | B2 | 3/2006 |
| JP | 2006-158186 | A | 6/2006 |
| JP | 2006-185942 | | 7/2006 |
| JP | 2006-521659 | A | 9/2006 |
| JP | 2006-318326 | A | 11/2006 |
| JP | 2005-122979 | | 5/2007 |
| JP | 2007-120506 | | 5/2007 |
| JP | 2008-311602 | A | 12/2008 |
| KR | 10-2005-0006042 | | 1/2005 |
| WO | WO 00/13310 | | 3/2000 |
| WO | WO 02/03087 | A1 | 1/2002 |
| WO | WO 2006/136321 | A1 | 12/2006 |
| WO | WO 2007/043389 | A1 | 4/2007 |
| WO | WO 2007/096868 | A1 | 8/2007 |
| WO | WO 2008/086050 | A2 | 7/2008 |
| WO | WO 2008/086050 | A3 | 7/2008 |
| WO | WO 2009/064682 | A2 | 5/2009 |
| WO | WO 2009/064682 | A3 | 5/2009 |
| WO | WO 2009/157763 | A2 | 12/2009 |
| WO | WO 2010/004475 | A1 | 1/2010 |
| WO | WO 2013/006272 | | 1/2013 |
| WO | WO 2013/006272 | A1 | 1/2013 |

OTHER PUBLICATIONS

PCT International Preliminary Report on Patentability and Written Opinion of the ISA dated Jan. 16, 2014; for PCT Pat. App. No. PCT/US2012/044149; 7 pages.

U.S. Appl. No. 14/147,167, filed Jan. 7, 2014, Szczeszynski et al.

Szczeszynski et al.; U.S. Appl. No. 12/966,139, filed Dec. 13, 2010; 36 page.

Szczeszynski; U.S. Appl. No. 13/096,082, filed Apr. 28, 2011; 20 pages.

"Integrated 8-channel LED Drivers with Switch-Mode Boost and SEPIC Controller," MAXIM; MAX 16807/MAX16808; #19-6055; Oct. 2006; pp. 1-21.

"Charge-Pump and Step-Up DC-DC Converter Solutions for Powering White LEDs in Series of Parallel Connections;" Dallas Semiconductor MAXIM; Apr. 23, 2002, 15 pages.

"White LED Driver IC;" NPC Nippon Precision Circuits, Inc.; SM8132A; May 2005; pp. 1-18.

"WLED Backlight Drivers with True Shutdown and OVP;" A8432 and A8433: Allegro MicroSystems, Inc. Concept Data Sheet; Jan. 25, 2005; 6 pages.

Allegro Microsystems, Inc., Data Sheet A8500; "Flexible WLED/RGB Backlight Driver for Medium Size LCDs;" Jan. 2006-2010; pp. 1-16.

Allegro Microsystems, Inc., Data Sheet A8501; "2 MHz, 4 Channel x 100 mA WLED/RGB Driver with Output Disconnect;" Jan. 2008-2010; pp. 1-24.

Allegro Microsystems, Inc., Data Sheet A8502; "Wide Input Voltage Range, High Efficiency Fault Tolerant LED Driver;" Jan. 16, 2012; pp. 1-35.

Allegro Microsystems, Inc., Data Sheet A8503; "High Efficiency 6-Channel, 2 MHz, WLED/RGB Driver for Medium Displays, with Integrated 55 V Power Switch;" Jan. 2009; pp. 1-17.

Allegro Microsystems, Inc., Data Sheet A8504, "WLED/RGB Backlight Driver for Medium Size LCDs;" Jan. 2007-2009; pp. 1-18.

Allegro Microsystems Inc., Data Sheet A8508; "Wide Input Voltage Range, High Efficiency 8-Channel Fault Tolerant LED Driver;" Jul. 9, 2012; pp. 1-28.

Bakker et al.; "A CMOS Nested-Chopper Instrumentation Amplifier with 100-nV Offset;" IEEE Journal of Solid-State Circuits; vol. 35, No. 12; Dec. 2000; pp. 1877-1883.

Burkhart et al.; "A Monolithically Integrated 128 LED-Driver and its Application;" IEEE Transactions on Consumer Electronics; vol. CE-32, No. 1; Feb. 1986; pp. 26-31.

MAXIM Data Sheet; MAX1570; "White LED Current Regulator with 1x/1.5x High-Efficiency Charge Pump;" #19-2526; Jul. 2002; pp. 1-12.

(56) References Cited

OTHER PUBLICATIONS

MAXIM Data Sheet; MAX1574; "180mA, 1x/2x, White LED Charge Pump in 3mm x 3mm TDFN;" #19-3117; Dec. 2003; pp. 1-9.
MAXIM Data Sheet; MAX1576; "480mA White LED 1x/1.5./2x Charge Pump for Backlighting and Camera Flash;" #19-3326; Aug. 2005; pp. 1-14.
Raval, et al.; "DC-DC Converter Using Hysteretic Control and Associated Methods;" U.S. Appl. No. 13/591,570, filed Aug. 22, 2012.
ROHM, Data Sheet BD6066GU, Silicon Monolithic Integrated Circuit, Apr. 2005, pp. 1-6.
Szczeszynski et al.; U.S. Appl. No. 12/267,645, filed Nov. 10, 2008; Entitled: "Electronic Circuits for Driving Series Connected Light Emitting Diode Strings".
Szczeszynski; "Electronic Circuits and Techniques for Improving a Short Duty Cycle Behavior of a DC-DC Converter Driving a Load;" U.S. Appl. No. 13/177,070, filed Jul. 6, 2011.
Witt; Linear Technology; Design Notes; "Short-Circuit Protection for Boost Regulators;" Jan. 1997, 2 pages.
Partial PCT Search Report received with Invitation to Pay Additional Fees in PCT/US2008/050026 dated Jun. 16, 2008, 5 pages.
PCT International Preliminary Report on Patentability of the ISA dated May 27, 2010 for PCT/2008/082934; 14 pages.
PCT Search Report and Written Opinion for the ISA of PCT/US2008/082934 mailed Dec. 15, 2009, 17 pages.
PCT Search Report and Written Opinion of the ISA for PCTUS2008/050026 dated Aug. 29, 2008, 17 pages.
Raval, et al.; "LED Driver Having Priority Queue to Track Dominant LED Channel;" U.S. Appl. No. 13/591,564, filed Aug. 22, 2012.
U.S. Pat. No. 7,999,487 issued on Aug. 16, 2011 Part 1 of 5; 400 pages.
U.S. Pat. No. 7,999,487 issued on Aug. 16, 2011 Part 2 of 5; 400 pages.
U.S. Pat. No. 7,999,487 issued on Aug. 16, 2011 Part 3 of 5; 400 pages.
U.S. Pat. No. 7,999,487 issued on Aug. 16, 2011 Part 4 of 5; 400 pages.
U.S. Pat. No. 7,999,487 issued on Aug. 16, 2011 Part 5 of 5; 50 pages.
U.S. Pat. No. 8,169,161 issued on May 11, 2012 Part 1 of 5; 400 pages.
U.S. Pat. No. 8,169,161 issued on May 11, 2012 Part 2 of 5; 400 pages.
U.S. Pat. No. 8,169,161 issued on May 11, 2012 Part 3 of 5; 400 pages.
U.S. Pat. No. 8,169,161 issued on May 11, 2012 Part 4 of 5; 400 pages.
U.S. Pat. No. 8,169,161 issued on May 11, 2012 Part 5 of 5; 176 pages.
U.S. Appl. No. 13/591,564, filed Aug. 22, 2012, Raval et al.
U.S. Appl. No. 13/752,904, filed Jan. 29, 2013, Raval et al.
U.S. Appl. No. 14/149,167, filed Jan. 7, 2014, Szczeszynski et al.
Allegro Microsystems, Inc. A8432 and A8433 Data Sheets; WLED Backlight Drivers with True Shutdown and OVP; Jan. 25, 2005; pp. 1-6.
Linear Technology; Design Note 154; Short-Circuit Protection for Boost Regulators; 1997; pp, 1-2.
MAXIM, Data Sheet MAX16807/MAX16808, Integrated 8-Channel LED Drivers with Switch-Mode Boost and SEPIC Controller. Oct. 2006, pp. 1-21.
Nippon Precision Circuits, Inc.; SM8132A; "White LED Driver IC;" Nippon Precision Circuits, Inc.; May 2005; pp. 1-18.
Office Action dated Sep. 1, 2011; for U.S. Appl. No. 12/267,645; 24 pages.
Response filed Nov. 14, 2011; to U.S. Appl. No. 12/267,645; 7 pages.
Notice of Allowance dated Jan. 11, 2012; for U.S. Appl. No. 12/267,645; 10 pages.
312 Amendment filed Mar. 7, 2012; for U.S. Appl. No. 12/267,645; 4 pages.
Response to 312 Amendment filed Mar. 7, 2012; for U.S. Appl. No. 12/267,645; 2 pages.
Notice of Allowance; dated Oct. 9, 2013; for U.S. Appl. No. 13/428,654; 24 pages.
Office Action; dated Apr. 25, 2013; for U.S. Appl. No. 12/966,139; 20 pages.
Response to Office Action filed Jul. 24, 2013; to Office Action; dated Apr. 25, 2013; for U.S. Appl. No. 12/966,139; 11 pages.
Notice of Allowance dated Sep. 17, 2013; for U.S. Appl. No. 12/966,139; 16 pages.
Request for Continued Examination dated Oct. 29, 2013; for U.S. Appl. No. 12/966,139; 3 pages.
Notice of Allowance dated Nov. 12, 2013; for U.S. Appl. No. 12/966,139; 12 pages.
Taiwan Office Action and Search Report (in English); received Apr. 30, 2013; for TW Pat. App. No. 097144152; 15 pages.
Response to Taiwanese Office Action (with Claims in English); filed Jul. 11, 2013; for TW Pat. App. No. 097144152; 7 pages.
Taiwan Allowance Decision of Examination; dated Aug. 30, 2013; for Taiwanese Pat. App. No. 097144152; 2 pages.
Email from Taiwan International Patent & Law Office; dated Sep. 5, 2013; for Taiwanese Pat. App. No. 097144152; 2 pages.
PCT Search Report and Written Opinion of the ISA for PCT/US2011/062500 dated Apr. 3, 2012.
U.S. Appl. No. 11/619,675, filed Jan. 4, 2007 Part 1 of 2; pp. 1-305.
U.S. Appl. No. 11/619,675, filed Jan. 4, 2007 Part 2 of 2; pp. 1-313.
U.S. Pat. No. 7,675.245; Timeframe Dec. 14, 2009-Nov. 29, 2010; 198 pages.
U.S. Pat. No. 8,274,238; Part 1 of 6; 400 pages.
U.S. Pat. No. 8,274,238; Part 2 of 6; 400 pages.
U.S. Pat. No. 8,274,238; Part 3 of 6; 400 pages.
U.S. Pat. No, 8,274,238; Part 4 of 6; 400 pages.
U.S. Pat. No. 8,274,238; Part 5 of 6; 400 pages.
U.S. Pat. No. 8,274,238; Part 6 of 6; 52 pages.
U.S. Patent No. 7,999,487 issued on Aug. 16, 2011 Part 4 of 5, 400 pages.
Notification of Transmittal of the International Search Report and the Written Opinion of the International Searching Authority, or the Declaration, PCT/US2012/043275, Date of Mailing: Sep. 4, 2012, 10 pages
Notification of Transmittal of the International Search Report and the Written Opinion of the International Searching Authority, or the Declaration, PCT/US2012/044149, Date of Mailing: Oct. 1, 2012, 11 pages.
Letter from Yuasa and Hara dated Mar. 14, 2014; for Japanese Pat. App. No. 2010-534111; 1 page.
Japanese Notice of Allowance received Mar. 14, 2014; for Japanese Pat. App. No. 2010-534111; 3 pages.
Restriction Requirement dated Jun. 20, 2014 for U.S. Appl. No. 13/177,075, filed Jul. 6, 2011 7 pages.
Response to Restriction Requirement filed Aug. 15, 2014; to Restriction Requirement dated Jun. 20, 2014; for U.S. Appl. No. 13/177,075; 2 pages.
Second Preliminary Amendment filed Aug. 15, 2014; for U.S. Appl. No. 13/177,075; 10 pages.
Letter to Yuasa and Hara (including suggested claims) dated Sep. 23, 2014; for Japanese Pat. App. No. 2013-105879; 6 pages.
Japanese Claims as filed on Oct. 3, 2014; for Japanese Pat. App. No. 2013-105879; 4 pages.
Notice of Allowance dated Dec. 5, 2014; for U.S. Appl. No. 14/149,167; 27 pages.
Office Action dated Oct. 30, 2014; for U.S. Appl. No. 13/177,075; 24 pages.
Taiwan Office Action and Search Report, with English translation, dated Oct. 2, 2014; for Taiwan Pat. App. No. 101123288; 19 pages.
Response to May 28, 2014 Office Action as filed on Aug. 7, 2014 for U.S. Appl. No. 13/591,570, filed Aug. 22, 2012.
Notice of Allowance dated Oct. 9, 2014 for U.S. Appl. No. 13/591,570, filed Aug. 22, 2012.
Office Action dated May 28, 2014 for U.S. Appl. No. 13/591,570, filed Aug. 22, 2012.
Korean Notice to Submit a Response dated Nov. 19, 201,4; for Korean Pat. App. No. 10-2010-7009105; 3 pages.

(56) References Cited

OTHER PUBLICATIONS

International Preliminary Report on Patentability dated Mar. 5, 2015 for International PCT Application No. PCT/US2013/053162; 10 pages.
International Preliminary Report on Patentability dated Mar. 5, 2015 for International PCT Application No. PCT/US2013/053165; 6 pages.
Office Action dated Apr. 3, 2015 for U.S. Appl. No. 13/591,564; 15 pages.
PCT Search Report and Written Opinion of the ISA dated Oct. 8, 2013; for PCT Pat. App. No. PCT/US2013/053162; 13 pages.
U.S. Appl. No. 14/638,257, filed Mar. 4, 2015, Szczeszynski et al.
Office Action dated Feb. 18, 2015 corresponding to U.S. Appl. No. 14/147,811; 19 Pages.
Response filed Mar. 2, 2015; to Office Action dated Oct. 30, 2014; for U.S. Appl. No. 13/177,075; 16 Pages.
Taiwan Office Action and Search Report (with English Translation) dated Jan. 28, 2015 corresponding to Taiwan Patent Appl. No. 101123896; 13 Pages.
Japanese Notice of Reasons for Rejection (Engiish translation) dated Jan. 26, 2015; for Japanese Pat. App. No. 2014-078475 4 pages.
Letter to 21st Century Patent & Law Firm dated Feb. 4, 2015; for Korean Pat. App. No. 10-2010-7009105; 12 pages.
Letter from 21st Century Patent & Law Firm dated Feb. 16, 2015; for Korean Pat. App. No. 10-2010-7009105; 1 Page.
Korean Response and Amendment filed Feb. 16, 2015; for Korean Pat. App. No. 10-2010-7009105; 30 pages.
Letter to Taiwan international Patent & Law Office dated Feb. 17, 2015; for Taiwan Pat. App. No. 101123288; 16 pages.
Email from Taiwan lnternational Patent & Law Office dated Mar. 30, 2015; for Taiwan Pat. App. No. 101123288; 2 pages.
Taiwen Amendment and Response received Mar. 30, 2015; for Taiwan Pat. App. No. 101123288; 10 pages.
Taiwan Marked-Up Patent Specification (in English) as filed with Taiwan Argument and Amendment received Mar. 30, 2015; for Taiwan Pat. App. No. 101123288; 37 pages.
Response filed May 12, 2015; to Office Action dated Apr. 3, 2015; for U.S. Appl. No. 13/591,564; 13 pages.
Japanese Response filed Apr. 13, 2015; for Japanese Pat. App. No. 2014-078475; 6 pages.
Japanese Claims (English translation) filed Apr. 13, 2015; for Japanese Pat. App. No. 2014-078475; 2 pages.
Japanese Notice of Allowance dated May 12, 2015; for Japanese Pat. App. No. 2014-078475; 3 pages.
Japanese Claims as allowed (English translation) dated May 12, 2015; for Japanese Pat. App. No. 2014-078475; 2 pages.
Letter to Taiwan International Patent and Law Office dated Apr. 17, 2015; for Taiwanese Pat. App. No. 101123896; 16 pages.
Taiwanese Response filed Apr. 29, 2015; for Taiwanese Pat. App. No. 101123896; 4 pages.
Taiwanese Response Claims (translated) filed Apr. 29, 2015; for Taiwanese Pat. App. No. 101123896; 8 pages.
Taiwan Notice of Allowance and Taiwan IPO Search Report dated May 29 2015; for Taiwan Pat. App. No. 102124903; 3 pages.
Notice of Allowance dated Jun. 22, 2015; for U.S. Appl. No. 13/177,075; 25 pages.
Notice of Allowance dated Jun. 19, 2015; for U.S. Appl. No. 13/591,564; 10 pages.

* cited by examiner

ELECTRONIC CIRCUITS AND TECHNIQUES FOR IMPROVING A SHORT DUTY CYCLE BEHAVIOR OF A DC-DC CONVERTER DRIVING A LOAD

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to electronic circuits used to drive a load, for example, a light emitting diode (LED) load.

BACKGROUND OF THE INVENTION

A variety of electronic circuits are used to drive loads and, more particularly, to control electrical current through strings of series connected light-emitting diodes (LEDs), which, in some embodiments, form an LED display, or, more particularly, a backlight for a display, for example, a liquid crystal display (LCD). It is known that individual LEDs have a variation in forward voltage drop from unit to unit. Therefore, the strings of series connected LEDs can have a variation in forward voltage drop.

Strings of series connected LEDs can be coupled to a common DC-DC converter, e.g., a switching regulator, e.g., a boost switching regulator, at one end of the LED strings, The switching regulator can be configured to provide a high enough voltage to supply each of the strings of LEDs. The other end of each of the strings of series connected LEDs can be coupled to a respective current sink, configured to sink a relatively constant current through each of the strings of series connected LEDs.

It will be appreciated that the voltage generated by the common switching regulator must be a high enough voltage to supply the one series connected string of LEDs having the greatest total voltage drop, plus an overhead voltage needed by the respective current sink. In other words, if four series connected strings of LEDs have voltage drops of 30V, 30V, 30V, and 31 volts, and each respective current sink requires at least one volt in order to operate, then the common boost switching regulator must supply at least 32 volts.

While it is possible to provide a fixed voltage switching regulator that can supply enough voltage for all possible series strings of LEDs, such a switching regulator would generate unnecessarily high power dissipation when driving strings of series connected LEDs having less voltage drop. Therefore, in some LED driver circuits, the voltage drops through each of the strings of series connected LEDs are sensed (for example, by a so-called "minimum select circuit," or by a multi-input amplifier) to select a lowest voltage or lowest average voltage appearing at the end of one of the strings of series connected LEDs. The common switching regulator is controlled to generate an output voltage only high enough to drive the series connected LED string having the lowest voltage (i.e., the highest voltage drop) or to drive a lowest average voltage to the strings. Arrangements are described, for example, in U.S. Pat. No. 6,822,403, issued Nov. 23, 2004, and in U.S. patent Ser. No. 12/267,645, filed Nov. 10, 2008, and entitled "Electronic Circuits for Driving Series Connected Light Emitting Diode Strings."

It will be understood that a predetermined current can be regulated though each one of the series connected diode strings, and the voltage of the DC-DC converter can be maintained just high enough to drive a worst case one of the diode strings, or to drive a worst case average voltage though the diode strings.

In some applications, it is desirable to dim or to brighten the LED diode strings. In some particular applications, it is desirable to brighten and to dim the LED diode string over a wide dynamic range.

In order to cause a dimming or brightening of the LEDs while still maintaining a desirable lowest voltage from the DC-DC converter (switching regulator), and while still maintaining the predetermined current through the diode strings, the predetermined current through the LEDs can be cycled on and off at a rate fast enough to be undetected by the human eye. When the current though the LEDs is on, the current equals the desirable predetermined current, and when the current through the LEDs is off, the current can be zero or some current less than the predetermined current.

When the current through the load is switched off, it is desirable to switch off the DC-DC converter, and when the current through the load is switched on, it is desirable to switch on the DC-DC converter. If the DC-DC converter is left on when the current through the load is switched off, the DC-DC converter would lack feedback control and the output voltage of the DC-DC converter could move to a different voltage, which is undesirable.

In order to achieve the wide dynamic range of brightness required by some applications, the on time of the current and the on time of the DC-DC converter must be able to be very short. For reasons described below, DC-DC converters are unable to achieve very short on times when switched on and off.

A DC-DC converter is often used in a feedback arrangement, in which a current or voltage at a load is sensed and the sensed current or voltage is used in a feedback loop to control the output voltage of the DC-DC converter. In a feedback loop, there is often so-called "compensation," often in the form of a capacitor or filter, in order to slow the response time of the feedback loop in order to maintain stability.

Furthermore, many types of DC-DC converters, and switching regulators in particular, use an inductor to store energy during operation. The DC-DC converter, and the inductor in particular, require a finite time to reach steady state operation, and to reach a steady state output voltage.

In view of the above, it should be recognized that, when a short on time is desired to achieve a wide brightness dynamic range, the DC-DC converter may not behave properly in short duty cycle operation and fluctuations of the output voltage of the DC-DC converter may result, which may result in undesirable fluctuation (flicker) in the brightness of the LEDS.

It would be desirable to provide a circuit and technique that can achieve a wide dynamic range of power provided by a DC-DC converter to a load in a feedback loop arrangement, while allowing a DC-DC converter to maintain proper operation and proper voltage regulation.

SUMMARY OF THE INVENTION

The present invention provides circuits and techniques that can achieve a wide dynamic range of power provided by a DC-DC converter to a load in a feedback loop arrangement, while allowing a DC-DC converter to maintain proper operation and proper voltage regulation.

In accordance with one aspect of the present invention, an electronic circuit to provide a regulated voltage to a load includes a PWM input node coupled to receive a pulse width modulated (PWM) signal having first and second states with a variable duty cycle. The electronic circuit also includes a capacitor voltage node coupled to receive a capacitor voltage held on a capacitor. The electronic circuit also includes an on-time extension circuit comprising an input node, a control node, and an output node. The input node of the on-time extension circuit is coupled to the capacitor voltage node and the control node of the on-time extension circuit is coupled to the PWM input node. The on-time extension circuit is configured to generate at the output node of the on-time extension circuit an extended PWM signal having a first state and a second state. The first state of the extended PWM signal longer in time than the first state of the PWM signal by an amount determined in proportion to the capacitor voltage.

In accordance with another aspect of the present invention, a method of providing a regulated voltage to a load includes coupling the regulated voltage generated by a DC-DC converter to the load, the DC-DC converter coupled to receive a control signal having an on condition and an off condition to turn the DC-DC converter on and off, accordingly. The method also includes receiving a pulse width modulated (PWM) signal. The method also includes adjusting time durations of the on condition in the off condition of the control signal in accordance with time durations of a first state and a second state of an extended PWM signal related to the PWM signal. The first state of the extended PWM signal is extended to be longer than the first state of the PWM signal so that the on condition of the control signal is longer than the on condition of a predetermined current through the load.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "boost switching regulator" is used to describe a known type of switching regulator that provides an output voltage higher than an input voltage to the boost switching regulator. While a certain particular circuit topology of boost switching regulator is shown herein, it should be understood that boost switching regulators have a variety of circuit configurations. As used herein, the term "buck switching regulator" is used to describe a known type of switching regulator that provides an output voltage lower than an input voltage to the buck switching regulator. It should be understood that there are still other forms of switching regulators other than a boost switching regulator and other than a buck switching regulator, and this invention is not limited to any one type.

DC-DC voltage converters (or simply DC-DC converters) are described herein. The described DC-DC converters can be any form of DC-DC converter, including, but not limited to, the above-described boost and buck switching regulators.

As used herein, the term "current regulator" is used to describe a circuit or a circuit component that can regulate a current passing through the circuit or circuit component to a predetermined, i.e., regulated, current. A current regulator can be a "current sink," which can input a regulated current, or a "current source," which can output a regulated current. A current regulator has a "current node" at which a current is output in the case of a current source, or at which a current is input in the case of a current sink.

Figure 1:
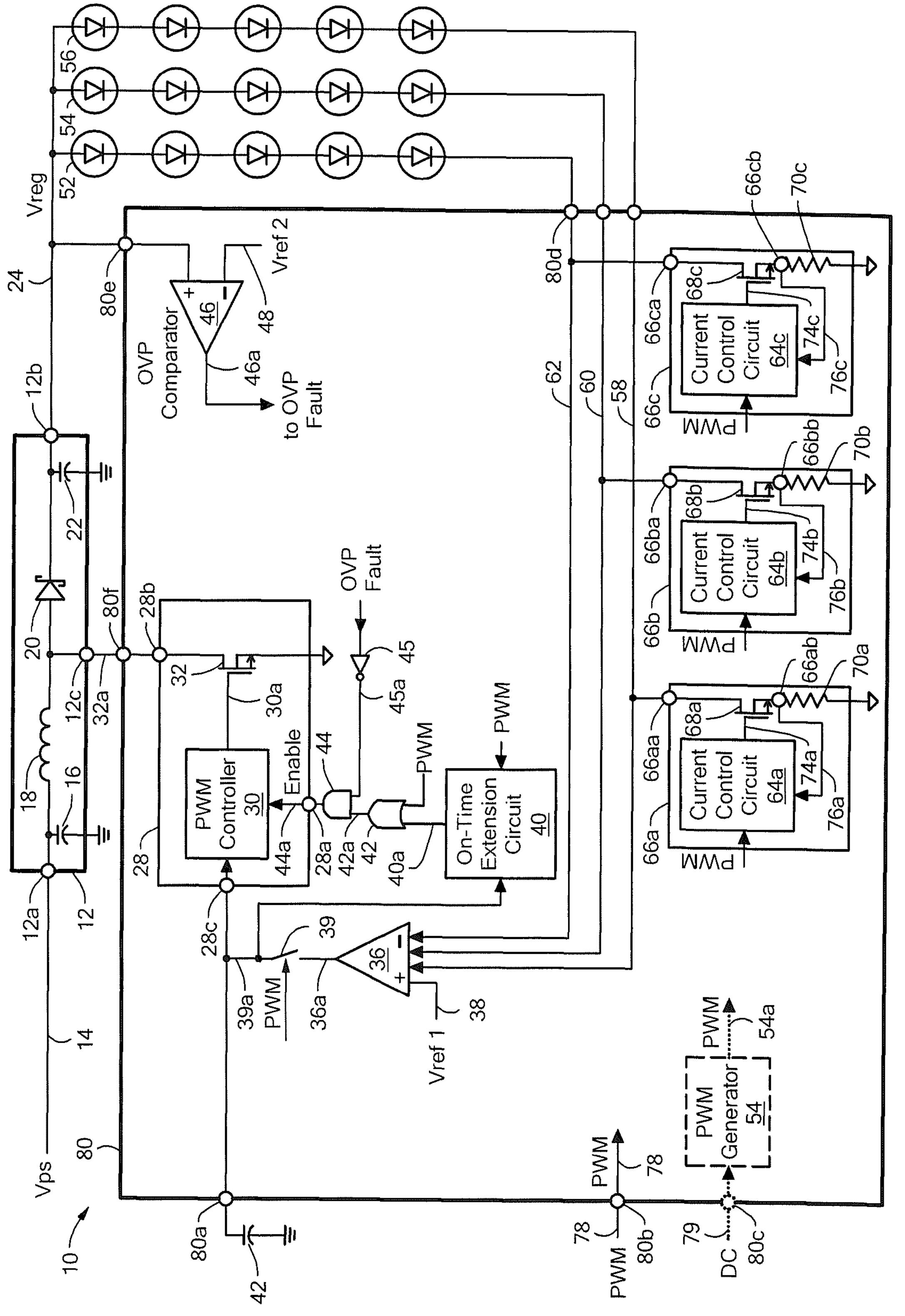
FIG. 1 is a block diagram showing an exemplary circuit to drive a load, the circuit having a DC-DC voltage converter, in the form of a switching regulator, and current regulators coupled on opposite sides of series coupled light emitting diode (LED) strings, and for which a power to the load (the LEDs) can be pulsed using a pulse width modulated (PWM) signal, wherein the PWM signal is applied to turn on and off the current regulators, the circuit also having an on-time extension circuit to extend on times of an extended PWM signal applied to turn on and off the DC-DC voltage converter.

Referring to FIG. 1, an exemplary electronic circuit 10 includes a controllable DC-DC converter 12 coupled to one or more loads, for example, series connected diode strings 52, 54, 56, which, in some arrangements, are series connected light emitting diode (LED) strings as may form an LED display or a backlight for a display, for example, a liquid crystal display (LCD). As described above, in some arrangements, the controllable DC-DC converter 12 is a switching regulator. The series connected LED strings strings 52, 54, 56 are coupled to respective current regulators 66_a_, 66_b_, 66_c_, here shown to be current sinks. The current regulators 66_a_, 66_b_, 66_c_ have respective voltage sense nodes 66_aa_, 66_ba_, 66_ca_, respective current sense nodes 66_ab_, 66_bb_, 66_cb_, and respective current control circuits 64_a_, 64_b_, 64_c_.

Operation of the current regulators 66_a_, 66_b_, 66_c_ is described more fully below in conjunction with FIGS. 3 and 4. Let it suffice here to say that the current regulators 66_a_, 66_b_, 66_c_ maintain a predetermined voltage at the current sense nodes 66_ab_, 66_bb_, 66_cb_, resulting in predetermined currents flowing through resistors 70_a_, 70_b_, 70_c_ and through the current regulators 66_a_, 66_b_, 66_c_.

At the same time, the switching regulator 12 is controlled in a feedback arrangements to maintain sufficient voltage (as little as possible) at the voltage sense nodes 66_aa_, 66_ba_, 66_ca_ to allow the current regulators 66_a_, 66_b_, 66_c_ to operate.

Since the series connected LED strings 52, 54, 56, can each generate a different voltage drop, the voltages appearing at the voltage sense nodes 66*aa*, 66*ba*, 66*ca* can be different. It will also be recognized that at least a predetermined minimum voltage must be present at each of the voltage sense nodes 66*aa*, 66*ba*, 66*ca* in order for each of the current regulators 66*a*, 66*b*, 66*c* to function properly, i.e., to sink the desired (predetermined) current for which they are designed. It is desirable to maintain voltages at the voltages sense nodes 66*aa*, 66*ba*, 66*ca* as low as possible to conserve power, but high enough to achieve proper operation.

A multi-input error amplifier 36 is coupled to receive voltage signals 58, 60, 62 corresponding to voltages appearing at the voltage sense nodes 66*aa*, 66*ba*, 66*ca*, respectively, at one or more inverting input nodes. The multi-input error amplifier 36 is also coupled to receive a reference voltage signal 38, for example, 0.5 volts, at a non-inverting input node. The multi-input error amplifier 36 is configured to generate an error signal 36*a*, which is related to an opposite of an arithmetic mean of the voltage signals 58, 60, 62. In some particular arrangements, the multi-input error amplifier 36 has inputs comprised of metal oxide semiconductor (MOS) transistors. In some arrangements, the error amplifier 36 is a transconductance amplifier, which provides a current-type output.

A switch 39 is coupled to receive the error signal 36*a* and configured to generate a switched error signal 39*a* under control of a pulse width modulated (PWM) signal 78 (or alternately, 54*a*). The PWM signal 78 is described more fully below. A duty cycle of the PWM signal 78 is controlled from outside of the circuit 10.

The circuit 10 can include a capacitor 42 coupled to receive the switched error signal 39*a*. In one particular arrangement, the capacitor 42 has a value of about one hundred picofarads. The capacitor 42 can provide a loop filter and can have a value selected to stabilize a feedback control loop.

A DC-DC converter controller 28 is coupled to receive the switched error signal 39*a* at an error node 28*c*.

A so-called "on-time extension circuit" 40 is coupled to receive the switched error signal 39*a*, coupled to receive the PWM signal, and configured to generated an extended PWM signal 40*a*. The on-time extension circuit is described more fully below in conjunction with FIG. 5. Let it suffice here to say that, particularly for very short duty cycles (i.e., short periods of the high state) of the PWM signal 78, the extended PWM signal 40*a* has a longer state, e.g., high state, period than the PWM signal.

A gate, for example, an OR gate 42, can be coupled to receive the extended PWM signal 40*a*, coupled to receive the PWM signal 78, and configured to generate a control signal 42*a*.

Another gate, for example, an AND gate 44, can be coupled to receive the control signal 42*a*, coupled to receive a circuit error signal, for example, an overvoltage (OVP) signal 45*a*, and configured to generate a control signal 44*a*.

At an enable node 28*a*, the DC-DC converter controller 28 can be turned on and off by the control signal 44*a*.

The DC-DC converter controller 28 can include a PWM controller 30 configured to generate a DC-DC converter PWM signal 30*a*, which is a different PWM signal than the PWM signal described above. The DC-DC converter PWM signal 30*a* can have a higher frequency (e.g., 100 KHz) than the PWM signal 78 (e.g., 200 Hz).

A switch, for example, a FET switch 32, can be coupled to receive the DC-DC converter PWM signal 30*a* at its gate, the FET configured to provide a switching control signal 32*a* to the DC-DC converter 12. Operation of the DC-DC converter 12, here shown to be a boost switching regulator, in conjunction with the switching control signal 32*a*, will be understood. Each time the switch 32 closes, current flows through an inductor 18, storing energy, and each time the switch 32 opens, the energy is released to a capacitor 22. If the closure time of the switch 32 is too short, energy cannot build in the inductor 18 to a steady state condition and the switching regulator 12 does not function properly, which may result in fluctuations of the output voltage 24. The voltage fluctuations can result in fluctuations in the brightness (flicker) of the LEDs 52, 54, 56, particularly since, as described below, the voltages at the voltage sense node 66*aa*, 66*bas*, 66*ca* are controlled to provide only a small headroom for proper operation of the current generators 66*a*, 66*b*, 66*c*. Therefore, it may be desirable to extend the on-time of the switching regulator 12 when the current regulators 66*a*, 66*b*, 66*c* operate with the very short PWM duty cycle.

The controllable DC-DC converter 12 is also coupled to receive a power supply voltage 14, Vps, at an input node 12*a* and to generate a regulated output voltage 24 at an output node 14*a* in response to the error signal 36*a*, and in response to the switching control signal 32*a*. In some arrangements, the controllable DC-DC converter 12 is a boost switching regulator and the controllable DC-DC converter 12 is coupled to receive the power supply voltage, Vps, at the input node 12*a* and to generate a relatively higher regulated output voltage 24 at the output node 12*b*.

With this arrangement, the controllable DC-DC converter 12 is controlled by an arithmetic mean of the voltage signals 58, 60, 62. Thus, an arithmetic mean of the voltage signals 58, 60, 62 that would be too low to provide proper operation of an associated one of the current regulators 66*a*, 66*b*, 66*c* will result in an increase in the error signal 36*a*, tending to raise the output voltage 24 of the controllable DC-DC converter 12. Thus, the DC-DC converter 12 is controlled in a feedback loop arrangement.

It should be appreciated that the regulated output voltage 24 has a particular desired value. Specifically, the particular desired value of the regulated output voltage 24 is that which achieves a high enough voltage at all of the current regulators 66*a*, 66*b*, 66*c* so that they can all operate properly to regulate current as desired. In addition, the particular desired value of the regulated output voltage 24 is that which is as low as possible so that the one or more of the current regulators that receive the lowest voltage(s) (i.e., the greatest voltage drop across the associated series connected LED strings 52, 54, 56) have just enough voltage to properly operate. With this particular desired value of the regulated output voltage 24, a low power is expended in the current regulators 66*a*, 66*b*, 66*c* resulting in high power efficiency while properly illuminating the LEDs.

In some particular arrangements, the desired value of regulated voltage 24 can include a voltage margin (e.g., one volt). In other words, in some arrangements, the particular desired value of the regulated output voltage 24 is that which is as low as possible so that the one or more of the current regulators that receive the lowest voltage(s) have just enough voltage to properly operate, plus the voltage margin. Still, an acceptably low power consumption can result.

The above described error signal 36*a*, which is the arithmetic mean of the voltage signals 58, 60, 62, approximately achieves the particular desired value of the regulated output voltage 24.

Certain elements of the circuit 10 can be within a single integrated circuit. For example, in some arrangements, circuit 80 is within an integrated circuit and other components are outside of the integrated circuit.

In some alternate arrangements, the multi-input error amplifier 32 is replaced by a multi-input comparator, which either has hysteresis, or which is periodically clocked at which time it makes a comparison.

The above-described PWM signal 78, for example, the PWM signal 78 received by the on-time extension circuit 40, received by the switch 39, and receive by the current regulators 66*a*, 66*b*, 66*c*, can be received at a PWM node 80*b* of the integrated circuit 80. In some alternate embodiments, in place of the PWM signal 78, another signal, for example, a DC signal 79, can be received at a control node 80*c*, in which case, an optional PWM generator 54 can be coupled to receive the DC signal and can be configured to generate a PWM signal 54*a*. The PWM signal 54*a* can have a duty cycle related to a value of the DC signal 79. Either the PWM signal 78 or the PWM signal 54*a* can be used as the PWM signal indicated in other parts of the circuit 10.

In operation, in order to control a brightness of the LEDs 52, 54, 56, or, more generally, a power delivered to a load, a duty cycle of the PWM signal 78 (or 54*a*) can be varied. When the PWM signal is high, the circuit 10 operates in a closed loop arrangement, i.e., the switch 39 is closed the current control circuits 64*a*, 64*b*, 64*c* are enabled, and the PWM controller 28 is enabled, causing the switching control signal 32*a* to switch. When the PWM signal is high, the voltage signals 58, 60, 62 are controlled and the currents passing through the current regulators 66*a*, 66*b*, 66*c* are controlled.

When the PWM signal 78 (or 54*a*) is low, the circuit 10 is shut down in several regards. Currents passing through the current regulators 66*a*, 66*b*, 66*c* are stopped by way of the PWM signal 78 received by the current regulators 66*a*, 66*b*, 66*c*. The switch 39 is opened, causing the capacitor 42 to hold its voltage. The PWM controller 28 is disabled, causing the switching control signal 32*a* to stop switching, and the DC-DC converter 12 to stop converting. When stopped, voltage from the DC-DC converter 12, i.e., the voltage 24, is held on the capacitor 22, but tends to droop with time.

It will be understood that, when the PWM signal 78 goes from low to high for only a short period (i.e., the PWM signal 78 has only a short duty cycle), if the switching regulator were controlled by the PWM signal 78, the switching regulator 12 may not have sufficient time to achieve steady state operation. Therefore, when the PWM signal 78 has a short duty cycle, the on-time extension circuit 40 can operate to enable the PWM controller 30 for a time longer than a time that would be achieved by the high state of the PWM signal 78. Essentially, for longer high states of the PWM signal 78, the PWM controller 30 can be enabled by high states of the PWM signal 78, and for shorter high states of the PWM signal 78, the PWM controller 30 can be enabled instead by extended high states of the extended PWM signal 40*a*. Generation of the extended PWM signal 40*a* is described below in conjunction with FIG. 5.

Figure 2:
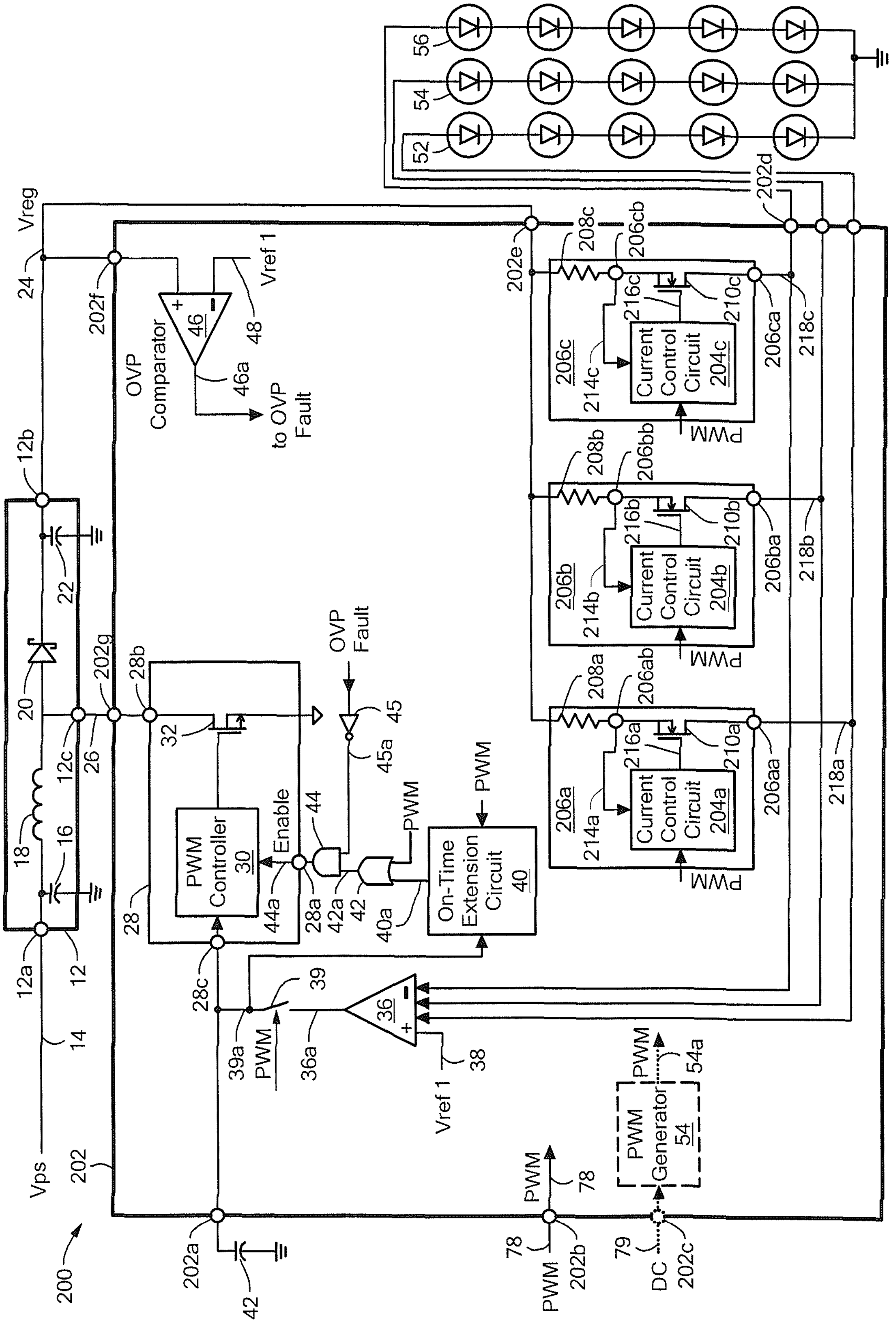
FIG. 2 is a block diagram showing another exemplary circuit to drive a load, the circuit having a DC-DC voltage converter, in the form of a switching regulator, and current regulators coupled on opposite sides of series coupled light emitting diode (LED) strings, and for which a power to the load (the LEDs) can be pulsed using a pulse width modulated (PWM) signal, wherein the PWM signal is applied to turn on and off the current regulators, the circuit also having an on-time extension circuit to extend on times of an extended PWM signal applied to turn on and off the DC-DC voltage converter.

Referring now to FIG. 2, in which like elements of FIG. 1 are shown having like reference designations, a circuit 200 is similar to the circuit 10 of FIG. 1. Current regulators 206*a*, 206*b*, 206*c*, are similar to the current regulators 66*a*, 66*b*, 66*c* of FIG. 1, however, the current regulators 206*a*, 206*b*, 206*c* are coupled to the bottom (cathode) ends of the series connected LED strings 52, 54, 56, respectively, instead of to the top (anode) ends of the series connected LED strings 52, 54, 56, respectively. In these embodiments, an input node 202*e* is coupled to receive the regulated output voltage 24, and output nodes, of which a node 202*d* is but one example, are coupled to the anode ends of the series connected LED strings 52, 54, 56, respectively. The inverting inputs of the error amplifier 36 are coupled to voltage sense node 206*aa*, 206*ba*, 206*ca*.

The current regulators 206*a*, 206*b*, 206*c* have the voltage sense nodes 206*aa*, 206*ba*, 206*ca*, respectively, current sense nodes 206*ab*, 206*bb*, 206*cb*, respectively, and current control circuits 204*a*, 204*b*, 204*c*, respectively.

Operation of the circuit 200, including brightness control, is similar to operation of the circuit 10 described above in conjunction with FIG. 1.

Figure 3:
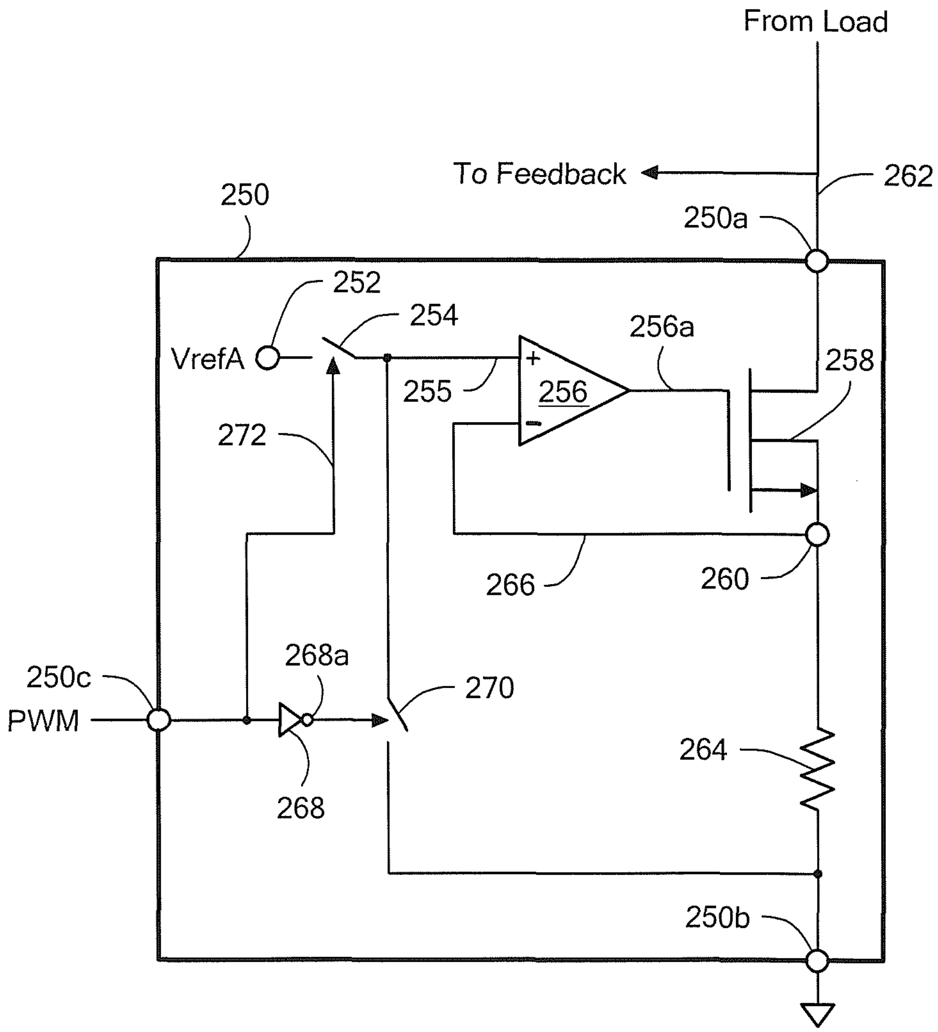
FIG. 3 is a block diagram showing an exemplary current regulator that can be used in the circuit of FIG. 1.

Referring now to FIG. 3, an exemplary current regulator circuit 250 can be the same as or similar to the current regulator circuits 66*a*, 66*b*, 66*c* of FIG. 1. The current regulator circuit 250 can include a node 250*c* coupled to receive a PWM signal 272, which can be the same as or similar to one of the PWM signals 78, 54*a* of FIG. 1.

A voltage sense node 250*a* can be the same as or similar to the voltage sense nodes 66*aa*, 66*ba*, 66*ca* of FIG. 1. A current sense node 260 can be the same as or similar to the current sense nodes 66*ab*, 66*bb*, 66*cb* of FIG. 1. A FET 258 can be the same as or similar to the FETs 68*a*, 68*b*, 68*c* of FIG. 1. A resistor 264 can be the same as or similar to the resistors 70*a*, 70*b*, 70*c* of FIG. 1.

The current regulator circuit 250 can include an amplifier 256 having an inverting input coupled to the current sense node 260, an output coupled to a gate of the FET 258, and a non-inverting input coupled, at some times, to receive a reference voltage, VrefA, through a switch 254, and coupled, at other times, to receive another reference voltage, for example, ground, through a switch 270. The switch 254 is coupled to receive the PWM signal 272 at its control input, and the switch 270 is coupled to receive an inverted PWM signal 268*a* at its control input via an inverter 268. Thus, the switches 254, 256 operate in opposition.

In operation, in response to a high state of the PWM signal 272, the switch 254 is closed and the switch 270 is open. In this state, the current regulator circuit 250 is enabled in a feedback arrangement and acts to maintain the reference voltage 252 as a signal 266 on the resistor 264, thus controlling a current through the resistor 264 and through the FET 258.

In response to a low state of the PWM signal 272, the switch 254 is open and the switch 270 is closed. In this state, an output signal 256*a* of the amplifier 256 is forced low, turning off the FET 258 (an N channel FET), and stopping current from flowing through the FET 258 and through the resistor 264. Thus, the current regulator circuit 250 can be enabled and disabled in accordance with states of the PWM signal 272.

Figure 4:
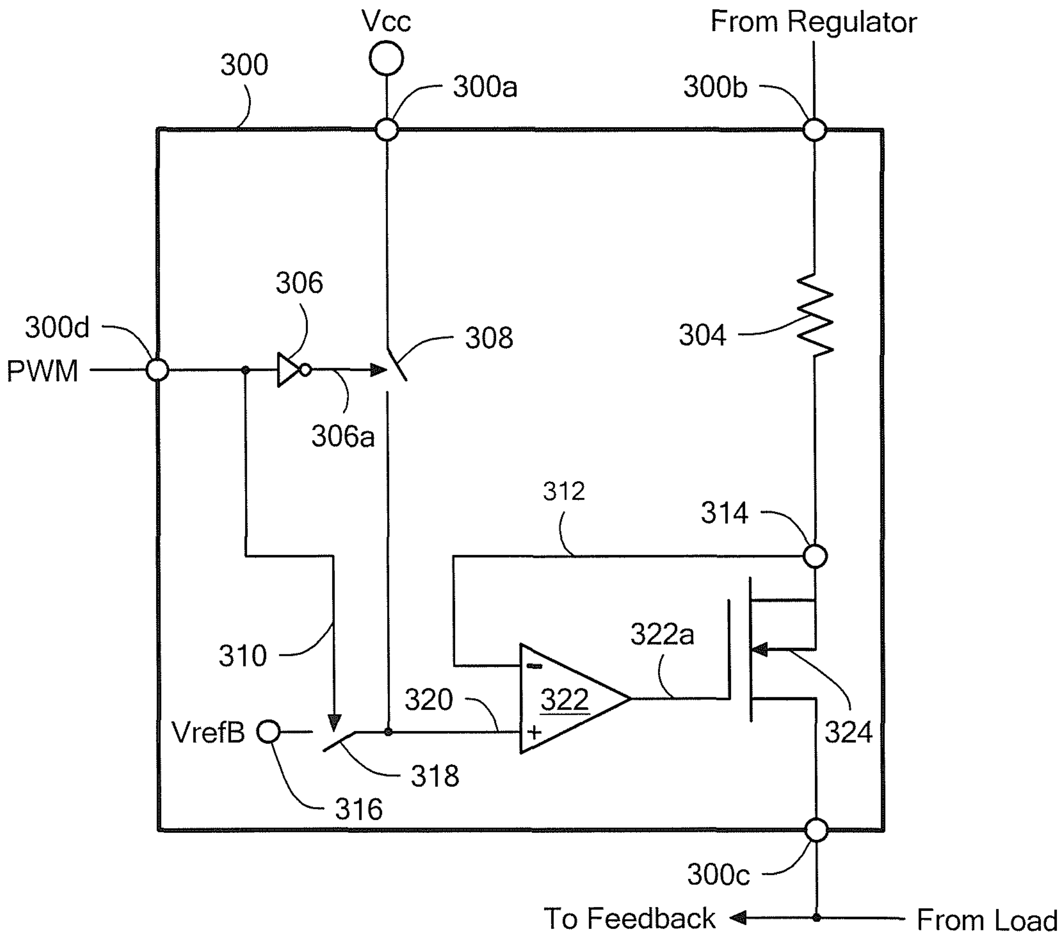
FIG. 4 is a block diagram showing an exemplary current regulator that can be used in the circuit of FIG. 2.

Referring now to FIG. 4, an exemplary current regulator circuit 300 can be the same as or similar to the current regulator circuits 206*a*, 206*b*, 206*c* of FIG. 2. The current regulator circuit 300 can include a node 300*d* coupled to receive a PWM signal 310, which can be the same as or similar to one of the PWM signals 78, 54*a* of FIG. 2.

A voltage sense node 300*c* can be the same as or similar to the voltage sense nodes 206*aa*, 206*ba*, 206*ca* of FIG. 2. A current sense node 314 can be the same as or similar to the current sense nodes 206*ab*, 206*bb*, 206*cb* of FIG. 2. A FET 324 can be the same as or similar to the FETs 210*a*, 210*b*, 210*c* of FIG. 2. A resistor 304 can be the same as or similar to the resistors 208*a*, 208*b*, 208*c* of FIG. 2.

The current regulator circuit 300 can include an amplifier 322 having an inverting input coupled to the current sense node 314, an output coupled to a gate of the FET 324, and a non-inverting input coupled, at some times, to receive a reference voltage, VrefB, through a switch 318, and coupled, at other times, to receive another reference voltage, for example, Vcc, through a switch 308. The switch 318 is coupled to receive the PWM signal 310 at its control input, and the switch 308 is coupled to receive an inverted PWM signal 306*a* at its control input via an inverter 306. Thus, the switches 318, 308 operate in opposition.

In operation, in response to a high state of the PWM signal 310, the switch 318 is closed and the switch 308 is open. In this state, the current regulator circuit 300 is enabled in a feedback arrangement and acts to maintain the reference voltage 316 as a signal 312 on the resistor 304, thus controlling a current through the resistor 304 and through the FET 324.

In response to a low state of the PWM signal 310, the switch 318 is open and the switch 308 is closed. In this state, an output signal 322*a* of the amplifier 322 is forced high, turning off the FET 324 (A P channel FET), and stopping current from flowing through the FET 324 and through the resistor 304. Thus, the current regulator circuit 300 can be enabled and disabled in accordance with states of the PWM signal 310.

Figure 5:
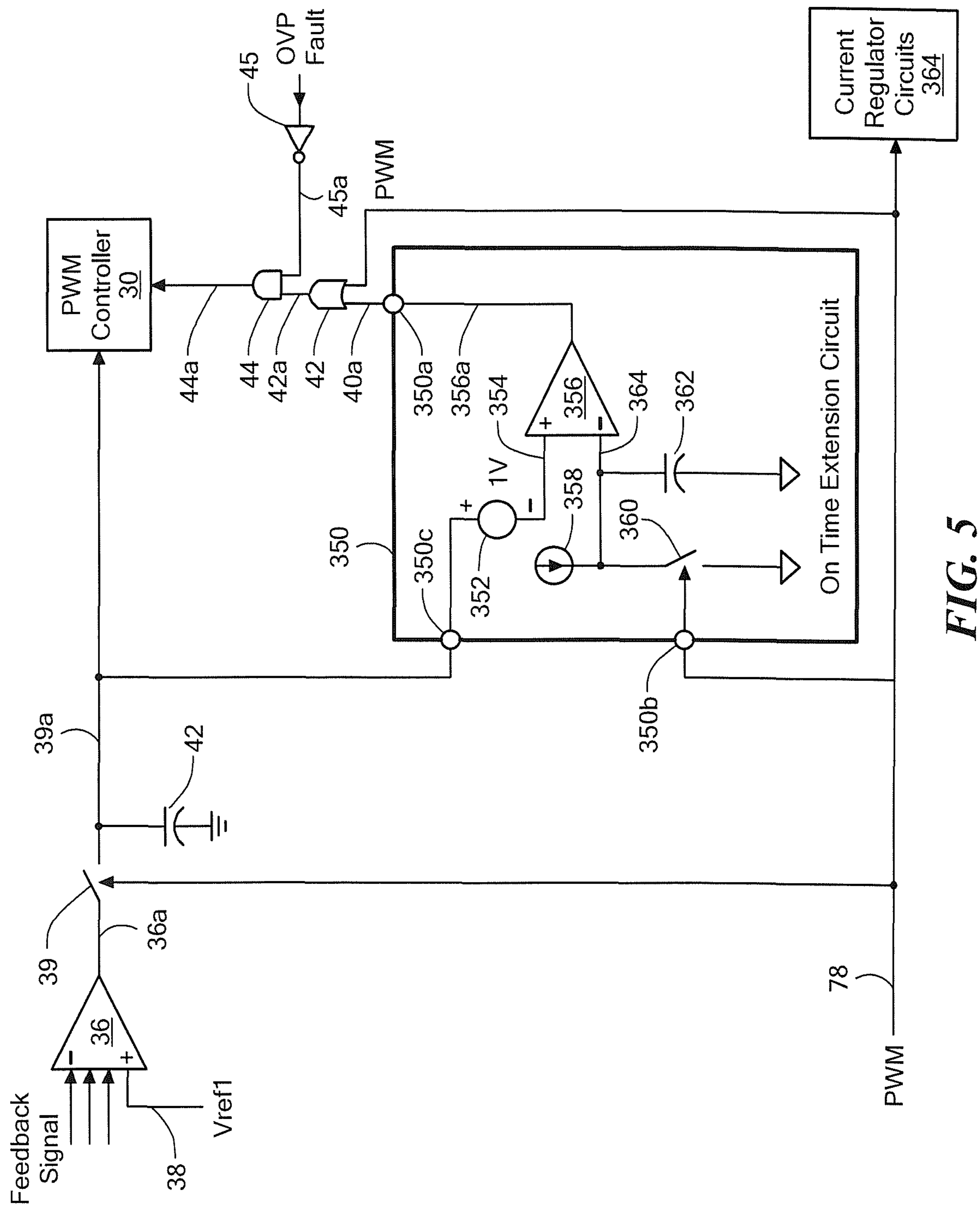
FIG. 5 is a block diagram of the on-time extension circuit that can be used as the on-time extension circuits of FIGS. 1 and 2.

Referring now to FIG. 5, in which like elements of FIGS. 1 and 2 are shown having like reference designations, an on-time extension circuit 350 can be the same as or similar to the on-time extension circuit 40 of FIGS. 1 and 2. Current regulator circuits 364 can be the same as or similar to the current regulator circuits 66*a*, 66*b*, 66*c* of FIG. 1 and the current regulator circuits 206*a*, 206*b*, 206*c* of FIG. 2.

The on-time extension circuit 350 can include an amplifier 356. Coupled to the inverting input of the amplifier 356 is an integrator comprised of a current source 358 coupled at a junction node to a capacitor 362, the junction node coupled to the inverting input.

A switch is coupled in parallel with the capacitor 362.

An offset voltage generator 352, for example, a one volt reference, is coupled at its lower voltage end to a non-inverting input of the amplifier 356. A higher voltage end of the offset voltage generator 352 is coupled to receive the switched error signal 39*a* via the switch 39 of FIGS. 1 and 2.

The switch 360 is coupled to receive the PWM signal 78 of FIGS. 1 and 2 (or optionally, the PWM signal 54*a*) at its control input.

The amplifier 356 is configured to generate an extended PWM signal 356*a*, which becomes the extended PWM signal 40*a* of FIGS. 1 and 2.

In operation, when the PWM signal 78 is in a high state, the switch 360 is closed and the capacitor 362 takes on a ground voltage. At the same time, the switch 39 is closed and the closed loop arrangement of FIGS. 1 and 2 operates normally. When operating normally, and with a reference voltage 38 of approximately eight hundred millivolts, a voltage on the capacitor 42 might achieve a voltage of approximately 1.5 volts. Thus, approximately 0.5 volts is presented at the non-inverting node of the amplifier, and the extended PWM signal 40*a* will be high.

When the PWM signal 78 goes low, the switch 360 opens and the switch 39 opens. At first, the extended PWM signal 40*a* remains high, thus the high state of the extended PWM signal 40*a* is extended beyond the end of the high state of the PWM signal 78. A voltage on the capacitor 362 ramps upward until it reaches the voltage at the non-inverting input of the amplifier 356, at which time, the extended PWM signal 40*a* takes on a low state.

It will be appreciated that the amount (in time) of the extension of the high state of the extended PWM signal 40*a* is proportional to the voltage on the capacitor 42. A higher capacitor voltage results in a longer time extension of the extended PWM signal 40*a*.

If the voltage on the capacitor is less than the voltage of the offset voltage generator 352, then a voltage appearing at the non-inverting input of the amplifier 356 will be at or below zero. In this case, the output signal 356*a* from the amplifier 356, and the extended PWM signal 40*a*, would stay in a low state regardless of operation of the switches 360, 39. In some embodiments, the offset voltage generate 352 has a voltage of about 1.5 volts.

The OR gate 42 is used to assure that the signal 42*a*, which ultimately controls the enabled condition of the PWM controller 30 that runs the DC-DC converter 12 of FIGS. 1 and 2, can never have a high state shorter than the high state of the PWM signal 78, but the signal 42*a* can have a high state longer than the high state of the PWM signal 78 in accordance with the extended PWM signal 40*a*, longer in proportion to the voltage on the capacitor 42.

From the circuit 350 of FIG. 5, it will be understood that there are two operating conditions. In a first operating condition, the voltage on the compensation capacitor 42 is in a first range, for example 0 to 1.5 volts. In the first operating condition, the circuit 10 of FIG. 1 is operating normally, and the switching regulator 12 is able to achieve its regulated voltage. In a second operating condition, the voltage on the compensation capacitor 42 is in a second range, for example 1.5 to 3.0 volts, i.e., greater than the voltage of the offset voltage generator 352. In the second operating condition, the circuit 10 of FIG. 1 is not operating normally, and the switching regulator 12 is generally not able to, or is barely able to, achieve its regulated voltage, e.g., due to short duty cycle PWM operation.

When the first operating condition exists, the control signal 44*a* has state durations the same as the PWM signal. When the second operating condition exists, the control signal 44*a* has a state, for example, a high state, extended by the time extension circuit 350.

With the above arrangement, it is possible to extend a dynamic range of power that can be delivered to the load, e.g., current pulses to the to the light emitting diode strings 52, 54, 56 of FIGS. 1 and 2, from about 100:1, to at least 1000:1, and to as much as 10,000:1, while maintaining proper operation of the DC-DC converter 12 of FIGS. 1 and 2.

While the circuit 350 provides the above-described time extension, it should be appreciated that there are many other circuits that can provide the same or a similar time extension, including both analog circuits and digital circuits.

Figure 6:
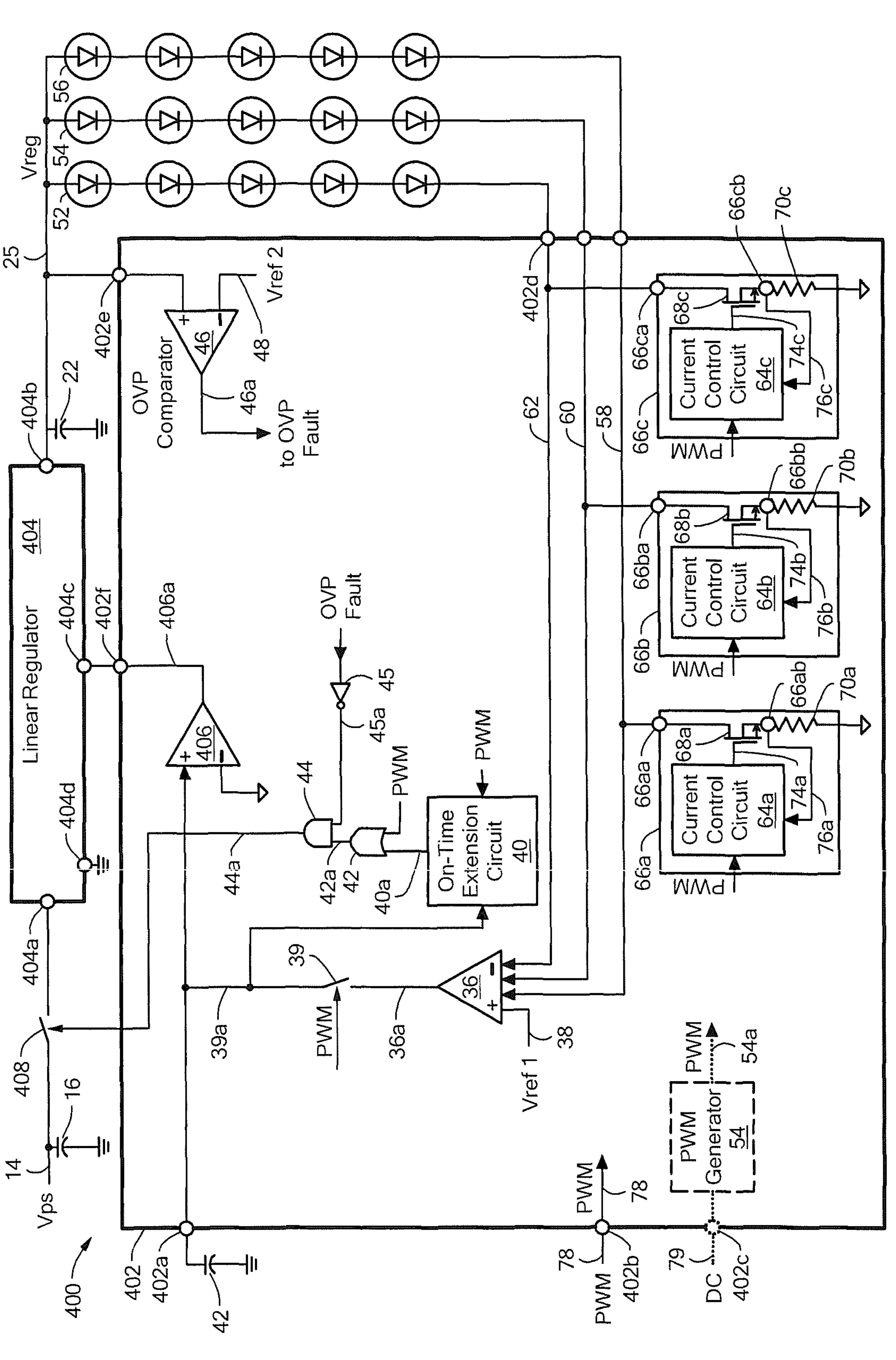
FIG. 6 is a block diagram showing another exemplary circuit to drive a load, the circuit having a DC-DC voltage converter, in the form of a linear voltage regulator, and current regulators coupled on opposite sides of series coupled light emitting diode (LED) strings, and for which a power to the load (the LEDs) can be pulsed using a pulse width modulated (PWM) signal, wherein the PWM signal is applied to turn on and off the current regulators, the circuit also having an on-time extension circuit to extend on times of an extended PWM signal applied to turn on and off the DC-DC voltage converter.

Referring now to FIG. 6, in which like elements of FIGS. 1 and 2 are shown having like reference designations, an exemplary electronic circuit 400 includes a controllable DC-DC converter 12, here in the form of an adjustable linear voltage regulator 404. The adjustable linear voltage regulator 404 can be a low dropout regulator. A low dropout regulator will be understood to be a voltage regulator that can operate with a very small input voltage to output voltage differential, for example, one volt.

It will be understood that, in order to conserve power, it may be desirable to turn off the linear regulator 404 when the current regulators 66*a*, 66*b*, 66*c* are turned off by control of the PWM signal 78. Even when turned off, the capacitor 22 holds the regulated voltage for some period of time.

The circuit 80 of FIG. 1 is replaced by a circuit 402. The circuit 402 does not include the circuit 28 of FIG. 1, but instead includes a buffer amplifier 406 that generates a control signal 406*a*.

The linear voltage regulator 404 includes an input node 404*a*, an output node 404*b*, a ground node 404*d*, and an adjustment node 404*c*. An output voltage 25 at the output node 404*b* is related to a voltage of the control signal 406*a* received at the adjustment node 404*c*.

It will be understood that the linear voltage regulator 404 requires a finite time required to turn on. Thus, for very short duty cycle PWM operation, the linear regulator 404 may not achieve proper operation, resulting is fluctuations of the output voltage 25. The voltage fluctuations can result in fluctuations in the brightness (flicker) of the LEDs 62, 54, 56, particularly since the voltages at the voltage sense node 66*aa*, 66*bas*, 66*ca* are controlled to provide only a small headroom for proper operation of the current generators 66*a*, 66*b*, 66*c*. Therefore, it may be desirable to extend the on-time of the linear regulator 404 when the current regulators 66*a*, 66*b*, 66*c* operate with the very short PWM duty cycle.

The linear regulator 404 can be turned on and off by way of a switch 408 that can be controlled by the control signal 44*a*. As described above, the control signal 44*a* can have state durations the same as the PWM signal 78 in the first operating condition, and can have an extended state when in the second operating condition. The first and second operating conditions are described above in conjunction with FIG. 5.

In other embodiments, the control signal 44*a* goes instead to internal portions of the linear regulator 404, and operates to turn the linear regulator 404 on and off by means internal to the linear regulator 404. In these embodiments, the switch 408 can be removed.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

The invention claimed is:

1. An electronic circuit to provide a regulated voltage to a load, the electronic circuit comprising:

a PWM input node coupled to receive a pulse width modulated (PWM) signal having first and second states with a variable duty cycle;

a capacitor voltage node coupled to receive a capacitor voltage held on a capacitor, and an on-time extension circuit comprising an input node, a control node, and an output node, the input node of the on-time extension circuit coupled to the capacitor voltage node, the control node of the on-time extension circuit coupled to the PWM input node, wherein the on-time extension circuit is configured to generate at the output node of the on-time extension circuit an extended PWM signal having a first state and a second state, the first state of the extended PWM signal longer in time than the first state of the PWM signal by an amount determined in proportion to the capacitor voltage wherein the on-time extension circuit further comprises:

a current source:

a capacitor coupled to receive a current from the current source;

a switch, the switch comprising an input node, an output node, and a control node, the control node of the switch coupled to the control node of the on-time extension circuit, the input node and the output node of the switch coupled to opposite ends of the capacitor;

an offset voltage generator comprising input node and an output node, the input node of the offset voltage generator coupled to the capacitor voltage node; and an amplifier comprising first and second input nodes and an output node, the first input node of the amplifier coupled to the output node of the offset voltage generator, the second input node of the amplifier coupled to a junction between the current source and the capacitor, the output node of the amplifier coupled to the output node of the on-time extension circuit, wherein, in response to the first state of the PWM signal, the switch is configured to discharge the capacitor, and wherein, in response to the second state of the PWM signal, the current source is configured to charge the capacitor.

2. The electronic circuit of claim 1, wherein when the first state of the extended PWM signal longer in time than the first state of the PWM signal by an amount determined in proportion to the capacitor voltage.

3. The electronic circuit of claim 1, wherein the load comprises a series coupled string of light emitting diodes.

4. The electronic circuit of claim 1, further comprising:

a switching regulator control node; and a switching regulator controller having an input node, an output node, and an enable node, the output node of the switching regulator controller coupled to the switching regulator control node, the input node of the switching regulator controller coupled to the capacitor voltage node, and the enable node of the switching regulator controller coupled to the output node of the on-time extension circuit, wherein the switching regulator controller does or does not generate a switching signal at the output node of the switching regulator controller depending upon a first or a second state, respectively, of the extended PWM signal generated by the on-time extension circuit.

5. The electronic circuit of claim 4, wherein, when the capacitor voltages is above the predetermined capacitor voltage, the switching regulator controller does or does not generate a switching signal at the output node of the switching regulator controller depending upon a first or a second state, respectively, of the extended PWM signal generated by the on-time extension circuit, and, when the capacitor voltage is not above predetermined capacitor voltage, the switching regulator controller does or does not generate the switching signal at the output node of the switching regulator controller depending upon the first or the second state, respectively, of the PWM signal.

6. The electronic circuit of claim 5, further comprising:

a load connection node configured to couple to the load; and a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal.

7. The electronic circuit of claim 4, wherein the switching regulator control node is configured to couple to a switching regulator, and wherein the switching regulator comprises an input node, a switched node, and an output node at which the regulated output voltage is generated, the switched node of the switching regulator coupled to the switching regulator control node, wherein the input node of the switching regulator is configured to receive an input voltage.

8. The electronic circuit of claim 7, wherein an output voltage at the output node of the switching regulator is substantially the same during the first and second states of the PWM signal and during the first and second states of the extended PWM signal.

9. The electronic circuit of claim 4, wherein the switching regulator controller comprises:

a pulse width modulation circuit having an output node and a control node, the control node of the pulse width modulation circuit coupled to the input node of the switching regulator controller.

10. The electronic circuit of claim 1, further comprising:

a load connection node configured to couple to the load; and a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal.

11. The electronic circuit of claim 10, further comprising:

an error amplifier comprising an input node and an output node, the input node of the error amplifier coupled to a different selected one of the input node or the output node of the current regulator circuit, wherein the error amplifier is configured to generate an error signal at the output node of the error amplifier; and a switch comprising an input node, an output node, and a control node, the input node of the switch coupled to the output node of the error amplifier, and the control node of the switch coupled to the PWM input node, and the output node of the switch coupled to the capacitor voltage node.

12. The electronic circuit of claim 11, further comprising:

a signal selection circuit having a plurality of input nodes and an output node, the output node of the signal selection circuit coupled to the input node of the error amplifier, one of the plurality of input nodes of the signal selection circuit coupled to the load connection node, wherein the signal selection circuit is configured to provide a signal at the output node of the signal selection circuit indicative of a signal at the plurality of input nodes of the signal selection circuit.

13. The electronic circuit of claim 1, wherein the extended PWM signal at the output node of the on-time extension circuit is operable to control an input voltage to a linear regulator, wherein the linear regulator is operable to provide a regulated voltage to the load.

14. A method of providing a regulated voltage to a load, the method comprising:

coupling the regulated voltage generated by a DC-DC converter to the load, the DC-DC converter coupled to receive a control signal having an on condition and an off condition to turn the DC-DC converter on and off accordingly;

receiving a pulse width modulated (PWM) signal;

with a current regulator circuit, drawing a predetermined current through the load, wherein the predetermined current has an on condition and an off condition, wherein the current regulator circuit draws the predetermined current during the on condition and does not draw the predetermined current during the off condition;

adjusting time durations of the on condition and the off condition of the predetermined current in accordance with time durations of a first state and a second state, respectively, of the PWM signal to result in the average current through the load;

adjusting time durations of the on condition and the off condition of the control signal in accordance with time durations of a first state and a second state of an extended PWM signal related to the PWM signal, wherein the first state of the extended PWM signal is extended to be longer than the first state of the PWM signal so that the on condition of the control signal is longer than the on condition of a predetermined current through the load; and receiving a sensed capacitor voltage:

wherein, when the sensed capacitor voltage is above a predetermined capacitor voltage, the adjusting the time durations of the on condition and the off condition of the control signal comprises:

adjusting the time durations of the on condition and the off condition of the control signal in accordance with the time durations of the first state and the second state, respectively, of the extended PWM signal, and wherein, when the sensed capacitor voltage is not above a predetermined capacitor voltage, the adjusting the time durations of the on condition and the off condition of the control signal comprises:

adjusting the time durations of the on condition and the off condition of the control signal in accordance with the time durations of the first state and the second state, respectively, of the PWM signal.

15. The method of claim 14, wherein the load comprises a series coupled string of light emitting diodes.

16. The method of claim 14, wherein the load comprises a series coupled string of light emitting diodes.

17. The method of claim 14, wherein the DC-DC converter comprises a switching regulator and wherein the control signal comprises a switching control signal.

18. The method of claim 14, wherein the DC-DC converter comprises a switching regulator and wherein the control signal comprises a switching control signal, wherein the switching control signal switches during the on condition and does not switch during the off condition.

19. The method of claim 14, wherein the DC-DC converter comprises a linear regulator.

20. An electronic circuit to provide a regulated voltage to a load, the electronic circuit comprising:

a PWM input node coupled to receive a pulse width modulated (PWM) signal having first and second states with a variable duty cycle;

a capacitor voltage node coupled to receive a capacitor voltage held on a capacitor;

an on-time extension circuit comprising an input node, a control node, and an output node, the input node of the on-time extension circuit coupled to the capacitor voltage node, the control node of the on-time extension circuit coupled to the PWM input node, wherein the on-time extension circuit is configured to generate at the output node of the on-time extension circuit an extended PWM signal having a first state and a second state, the first state of the extended PWM signal longer in time than the first state of the PWM signal by an amount determined in proportion to the capacitor voltage;

a switching regulator control node; and a switching regulator controller having an input node, an output node, and an enable node, the output node of the switching regulator controller coupled to the switching regulator control node, the input node of the switching regulator controller coupled to the capacitor voltage node, and the enable node of the switching regulator controller coupled to the output node of the on-time extension circuit, wherein the switching regulator controller does or does not generate a switching signal at the output node of the switching regulator controller depending upon a first or a second state, respectively, of the extended PWM signal generated by the on-time extension circuit.

21. The electronic circuit of claim 20, wherein when the first state of the extended PWM signal longer in time than the first state of the PWM signal by an amount determined in proportion to the capacitor voltage.

22. The electronic circuit of claim 20, wherein the load comprises a series coupled string of light emitting diodes.

23. The electronic circuit of claim 20, wherein the on-time extension circuit further comprises:

a current source;

a capacitor coupled to receive a current from the current source;

a switch, the switch comprising an input node, an output node, and a control node, the control node of the switch coupled to the control node of the on-time extension circuit, the input node and the output node of the switch coupled to opposite ends of the capacitor;

an offset voltage generator comprising an input node and an output node, the input node of the offset voltage generator coupled to the capacitor voltage node; and an amplifier comprising first and second input nodes and an output node, the first input node of the amplifier coupled to the output node of the offset voltage generator, the second input node of the amplifier coupled to a junction between the current source and the capacitor, the output node of the amplifier coupled to the output node of the on-time extension circuit, wherein, in response to the first state of the PWM signal, the switch is configured to discharge the capacitor, and wherein, in response to the second state of the PWM signal, the current source is configured to charge the capacitor.

24. The electronic circuit of claim 20, wherein, when the capacitor voltages is above the predetermined capacitor voltage, the switching regulator controller does or does not generate a switching signal at the output node of the switching regulator controller depending upon a first or a second state, respectively, of the extended PWM signal generated by the on-time extension circuit, and, when the capacitor voltage is not above predetermined capacitor voltage, the switching regulator controller does or does not generate the switching signal at the output node of the switching regulator controller depending upon the first or the second state, respectively, of the PWM signal.

25. The electronic circuit of claim 24, further comprising:

a load connection node configured to couple to the load; and a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal.

26. The electronic circuit of claim 20, wherein the switching regulator control node is configured to couple to a switching regulator, and wherein the switching regulator comprises an input node, a switched node, and an output node at which the regulated output voltage is generated, the switched node of the switching regulator coupled to the switching regulator control node, wherein the input node of the switching regulator is configured to receive an input voltage.

27. The electronic circuit of claim 25, wherein an output voltage at the output node of the switching regulator is substantially the same during the first and second states of the PWM signal and during the first and second states of the extended PWM signal.

28. The electronic circuit of claim 20, wherein the switching regulator controller comprises:

a pulse width modulation circuit having an output node and a control node, the control node of the pulse width modulation circuit coupled to the input node of the switching regulator controller.

29. The electronic circuit of claim 20, further comprising:

a load connection node configured to couple to the load; and a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal.

30. The electronic circuit of claim 29, further comprising:

an error amplifier comprising an input node and an output node, the input node of the error amplifier coupled to a different selected one of the input node or the output node of the current regulator circuit, wherein the error amplifier is configured to generate an error signal at the output node of the error amplifier; and a switch comprising an input node, an output node, and a control node, the input node of the switch coupled to the output node of the error amplifier, and the control node of the switch coupled to the PWM input node, and the output node of the switch coupled to the capacitor voltage node.

31. The electronic circuit of claim 30, further comprising:

a signal selection circuit having a plurality of input nodes and an output node, the output node of the signal selection circuit coupled to the input node of the error amplifier, one of the plurality of input nodes of the signal selection circuit coupled to the load connection node, wherein the signal selection circuit is configured to provide a signal at the output node of the signal selection circuit indicative of a signal at the plurality of input nodes of the signal selection circuit.

32. The electronic circuit of claim 20, wherein the extended PWM signal at the output node of the on-time extension circuit is operable to control an input voltage to a linear regulator, wherein the linear regulator is operable to provide a regulated voltage to the load.

33. An electronic circuit to provide a regulated voltage to a load, the electronic circuit comprising:

a PWM input node coupled to receive a pulse width modulated (PWM) signal having first and second states with a variable duty cycle;

a capacitor voltage node coupled to receive a capacitor voltage held on a capacitor;

an on-time extension circuit comprising an input node, a control node, and an output node, the input node of the on-time extension circuit coupled to the capacitor voltage node, the control node of the on-time extension circuit coupled to the PWM input node, wherein the on-time extension circuit is configured to generate at the output node of the on-time extension circuit an extended PWM signal having a first state and a second state, the first state of the extended PWM signal longer in time than the first state of the PWM signal by an amount determined in proportion to the capacitor voltage;

a load connection node configured to couple to the load;

a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal an error amplifier comprising an input node and an output node, the input node of the error amplifier coupled to a different selected one of the input node or the output node of the current regulator circuit, wherein the error amplifier is configured to generate an error signal at the output node of the error amplifier; and a switch comprising an input node, an output node, and a control node, the input node of the switch coupled to the output node of the error amplifier, and the control node of the switch coupled to the PWM input node, and the output node of the switch coupled to the capacitor voltage node.

34. The electronic circuit of claim 33, wherein when the first state of the extended PWM signal longer in time than the first state of the PWM signal by an amount determined in proportion to the capacitor voltage.

35. The electronic circuit of claim 33, wherein the load comprises a series coupled string of light emitting diodes.

36. The electronic circuit of claim 33, wherein the on-time extension circuit further comprises:

a current source;

a capacitor coupled to receive a current from the current source;

a switch, the switch comprising an input node, an output node, and a control node, the control node of the switch coupled to the control node of the on-time extension circuit, the input node and the output node of the switch coupled to opposite ends of the capacitor;

an offset voltage generator comprising an input node and an output node, the input node of the offset voltage generator coupled to the capacitor voltage node; and an amplifier comprising first and second input nodes and an output node, the first input node of the amplifier coupled to the output node of the offset voltage generator, the second input node of the amplifier coupled to a junction between the current source and the capacitor, the output node of the amplifier coupled to the output node of the on-time extension circuit, wherein, in response to the first state of the PWM signal, the switch is configured to discharge the capacitor, and wherein, in response to the second state of the PWM signal, the current source is configured to charge the capacitor.

37. The electronic circuit of claim 33, further comprising:

a switching regulator control node; and a switching regulator controller having an input node, an output node, and an enable node, the output node of the switching regulator controller coupled to the switching regulator control node, the input node of the switching regulator controller coupled to the capacitor voltage node, and the enable node of the switching regulator controller coupled to the output node of the on-time extension circuit, wherein the switching regulator controller does or does not generate a switching signal at the output node of the switching regulator controller depending upon a first or a second state, respectively, of the extended PWM signal generated by the on-time extension circuit.

38. The electronic circuit of claim 37, wherein, wherein, when the capacitor voltages is above the predetermined capacitor voltage, the switching regulator controller does or does not generate a switching signal at the output node of the switching regulator controller depending upon a first or a second state, respectively, of the extended PWM signal generated by the on-time extension circuit, and, when the capacitor voltage is not above predetermined capacitor voltage, the switching regulator controller does or does not generate the switching signal at the output node of the switching regulator controller depending upon the first or the second state, respectively, of the PWM signal.

39. The electronic circuit of claim 38, further comprising:

a load connection node configured to couple to the load; and a current regulator circuit comprising an input node, an output node, and a current enable node, a selected one of the input node or the output node of the current regulator circuit coupled to the load connection node, the current enable node coupled to the PWM input node, the current regulator circuit configured to pass a predetermined current from the input node to the output node, wherein the predetermined current is passed or not passed depending upon the first or the second state, respectively, of the PWM signal.

40. The electronic circuit of claim 37, wherein the switching regulator control node is configured to couple to a switching regulator, and wherein the switching regulator comprises an input node, a switched node, and an output node at which the regulated output voltage is generated, the switched node of the switching regulator coupled to the switching regulator control node, wherein the input node of the switching regulator is configured to receive an input voltage.

41. The electronic circuit of claim 40, wherein an output voltage at the output node of the switching regulator is substantially the same during the first and second states of the PWM signal and during the first and second states of the extended PWM signal.

42. The electronic circuit of claim 37, wherein the switching regulator controller comprises:

a pulse width modulation circuit having an output node and a control node, the control node of the pulse width modulation circuit coupled to the input node of the switching regulator controller.

43. The electronic circuit of claim 33, further comprising:

a signal selection circuit having a plurality of input nodes and an output node, the output node of the signal selection circuit coupled to the input node of the error amplifier, one of the plurality of input nodes of the signal selection circuit coupled to the load connection node, wherein the signal selection circuit is configured to provide a signal at the output node of the signal selection circuit indicative of a signal at the plurality of input nodes of the signal selection circuit.

44. The electronic circuit of claim 33, wherein the extended PWM signal at the output node of the on-time extension circuit is operable to control an input voltage to a linear regulator, wherein the linear regulator is operable to provide a regulated voltage to the load.

* * * * *